(12) United States Patent
Lin et al.

(10) Patent No.: US 8,629,568 B2
(45) Date of Patent: Jan. 14, 2014

(54) SEMICONDUCTOR DEVICE COVER MARK

(75) Inventors: Yan-Fu Lin, Zhubei (TW); Jing-Cheng Lin, Hsin-Chu (TW); Wen-Chih Chiou, Miaoli (TW); Shin-Puu Jeng, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 263 days.

(21) Appl. No.: 12/847,802

(22) Filed: Jul. 30, 2010

(65) Prior Publication Data

US 2012/0025368 A1    Feb. 2, 2012

(51) Int. Cl.
*H01L 23/544* (2006.01)
*H01L 21/76* (2006.01)

(52) U.S. Cl.
USPC ............ 257/794; 257/E23.179; 257/E21.503; 438/401

(58) Field of Classification Search
USPC .................. 257/737, 797, E23.179, E21.503; 438/126, 108, 125, 401, 406, 462
See application file for complete search history.

(56) References Cited

U.S. PATENT DOCUMENTS

| | | | |
|---|---|---|---|
| 4,811,082 A | 3/1989 | Jacobs et al. | |
| 4,990,462 A | 2/1991 | Sliwa, Jr. | |
| 5,075,253 A | 12/1991 | Sliwa, Jr. | |
| 5,380,681 A | 1/1995 | Hsu | |
| 5,481,133 A | 1/1996 | Hsu | |
| 5,744,379 A | 4/1998 | Mandai et al. | |
| 6,002,177 A | 12/1999 | Gaynes et al. | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 * | 3/2002 | Fung et al. | 438/107 |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,562,653 B1 | 5/2003 | Ma et al. | |
| 6,570,248 B1 | 5/2003 | Ahn et al. | |
| 6,593,168 B1 * | 7/2003 | Ehrichs et al. | 438/108 |
| 6,600,222 B1 | 7/2003 | Levardo | |
| 6,607,938 B2 | 8/2003 | Kwon et al. | |
| 6,636,313 B2 * | 10/2003 | Chen et al. | 356/401 |
| 6,661,085 B2 | 12/2003 | Kellar et al. | |
| 6,762,076 B2 | 7/2004 | Kim et al. | |
| 6,790,748 B2 | 9/2004 | Kim et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |
| 6,943,067 B2 | 9/2005 | Greenlaw | |
| 6,946,384 B2 | 9/2005 | Kloster et al. | |

(Continued)

*Primary Examiner* — Nikolay Yushin
(74) *Attorney, Agent, or Firm* — Slater & Matsil, L.L.P.

(57) ABSTRACT

A system and method for determining underfill expansion is provided. An embodiment comprises forming cover marks along a top surface of a substrate, attaching a semiconductor substrate to the top surface of the substrate, placing an underfill material between the semiconductor substrate and the substrate, and then using the cover marks to determine the expansion of the underfill over the top surface of the substrate. Additionally, cover marks may also be formed along a top surface of the semiconductor substrate, and the cover marks on both the substrate and the semiconductor substrate may be used together as alignment marks during the alignment of the substrate and the semiconductor substrate.

10 Claims, 8 Drawing Sheets

(56) References Cited

U.S. PATENT DOCUMENTS

| | | |
|---|---|---|
| 6,975,016 B2 | 12/2005 | Kellar et al. |
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,834,450 B2 | 11/2010 | Kang |
| 2003/0090006 A1* | 5/2003 | Farnworth .................... 257/787 |
| 2008/0073782 A1* | 3/2008 | Shin et al. .................... 257/737 |
| 2009/0236739 A1* | 9/2009 | Chen et al. .................... 257/737 |

* cited by examiner

SEMICONDUCTOR DEVICE COVER MARK

TECHNICAL FIELD

The present disclosure relates generally to a system and method of semiconductor manufacturing and, more particularly, to a system and method for providing cover marks for semiconductor chips.

BACKGROUND

A semiconductor device, such as a semiconductor chip, may be attached to a substrate using flip-chip technology. In this process a series of connectors, such as solder balls, are formed on one side of the semiconductor chip, and then the semiconductor chip is "flipped" so that the solder balls are placed into contact with an underlying substrate. A reflow process is then performed to reflow the solder balls and form the necessary electrical connections between the semiconductor chip and the underlying substrate. An underfill material may then be applied between the semiconductor chip and the substrate in order to protect, both physically and chemically, the reflowed solder balls.

In some instances the underfill material not only encapsulates the region between the semiconductor chip and the substrate, but may also laterally extend away from the semiconductor chip to cover a larger area of the substrate than the semiconductor chip itself. As semiconductor chips are scaled down to smaller and smaller sizes, this extension of the underfill material becomes more critical, as this excess underfill material is needlessly taking up valuable area on the substrate Furthermore, because the semiconductor chip is "flipped" over before it is placed onto the substrate, it is very difficult to accurately align the solder balls with their respective connections on the underlying substrate. Such an issue could lead to misalignments between the semiconductor chip and the substrate, and these misalignments could lead to unconnected power lines or missed signal lines, and at the worst, could cause a complete failure of communication between the semiconductor chip and the substrate.

SUMMARY

These and other problems are generally solved or circumvented, and technical advantages are generally achieved, by embodiments which provide for a cover mark on a substrate.

In accordance with an embodiment, a device comprises a substrate having a first surface, the substrate comprising a region of attachment, the region of attachment having one or more contact pads. One or more cover marks are along the first surface, the one or more cover marks being visible and comprising an indication of distance away from the region of attachment.

In accordance with another embodiment, a semiconductor device comprises a substrate with a first surface, the substrate comprising a first cover mark located around a first region of the first surface. A semiconductor substrate is attached to the first region, the semiconductor substrate comprising a second cover mark aligned with the first cover mark and located along a second surface facing away from the first surface.

In accordance with yet another embodiment, a method of manufacturing a semiconductor device comprises providing a substrate and forming a first cover mark on a first surface of the substrate. A semiconductor substrate is placed over the first surface of the substrate and an underfill material is placed between the substrate and the semiconductor substrate, the underfill material extending towards the first cover mark from the region between the substrate and the semiconductor substrate.

BRIEF DESCRIPTION OF THE DRAWINGS

For a more complete understanding of embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments, and do not limit the scope of the embodiments.

The embodiments will be described with respect to a specific context, namely a cover mark for a semiconductor chip in a flip chip configuration. The embodiments may also be applied, however, to other types of marks.

Figure 1A:
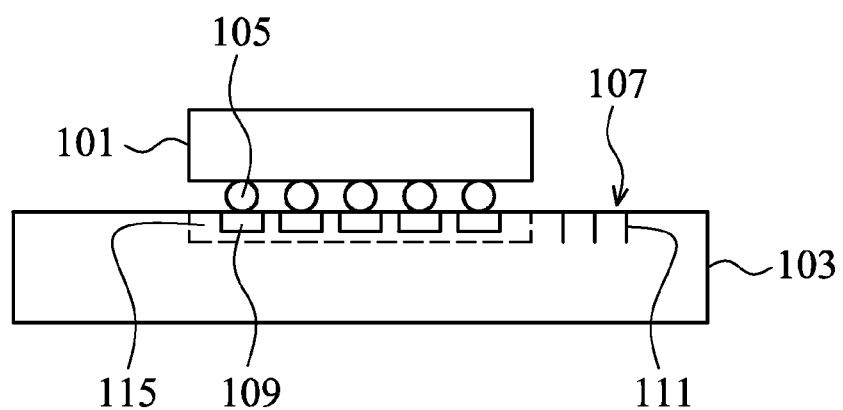
FIGS. 1A-1B illustrate a cross-sectional and plan view, respectively, of a semiconductor substrate and a substrate in a flip-chip arrangement in accordance with an embodiment.
Figure 1B:
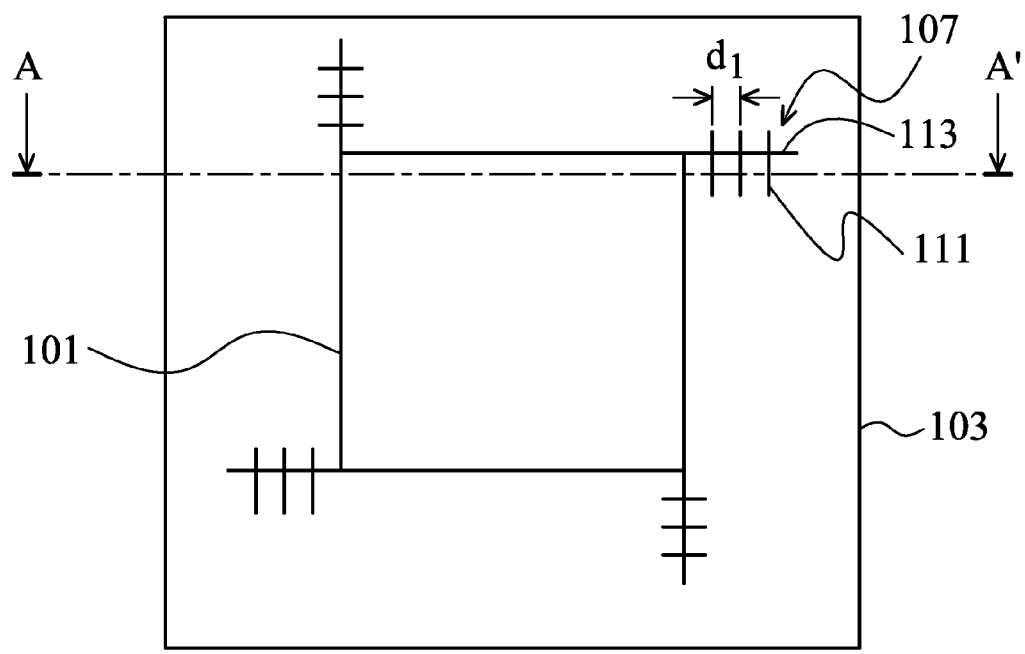

With reference now to FIGS. 1A and 1B, there is shown a cross-sectional and plan view, respectively, of a semiconductor substrate 101, a substrate 103, and contact bumps 105 in a flip-chip arrangement, with FIG. 1A illustrating the cross section of line A-A' in FIG. 1B. The semiconductor substrate 101 may be a semiconductor die that includes a semiconductor substrate having electronic devices formed therein and/or thereon and may, but not necessarily, include dielectric and conductive layers to provide connectivity and routing between the electronic devices. There could be any number of alternating layers of conductive and dielectric layers located on the semiconductor substrate 101, but a typical range of layers would be from three layers to twelve layers of alternating conductive and dielectric layers.

The substrate 103 structurally and electrically supports the semiconductor substrate 101. In an embodiment, the substrate 103 may be a printed circuit board which contains conductive routing in order to route electrical signals as well as power and ground connections to and from the semiconductor substrate 101. The electrical signals may be passed, for example, to from other devices (not shown) that may be located upon the substrate 103 such that the semiconductor substrate 101 and the other devices may work together to perform a desired function.

However, as one of ordinary skill in the art will immediately recognize, the substrate 103 is not intended to be limited by this discussion to merely a printed circuit board, as a printed circuit board is not the only method by which the semiconductor substrate 103 may be physically and electrically supported. Any other suitable supporting substrate, such as another semiconductor substrate 101 that may have electrical connections located in position to receive the electrical connections from the semiconductor substrate 103, an interposer, a high-density interconnect, a packaging substrate, or the like, may alternatively be utilized. Such alternative substrates are fully intended to be included within the scope of the embodiments.

The contact bumps 105 may be formed between the semiconductor substrate 101 and the substrate 103. The contact bumps 105 may comprise a material such as tin or other suitable materials, such as silver or copper, Al, Au, Ni. In an embodiment in which the contact bumps 105 are tin solder bumps, the contact bumps 105 may be formed by initially forming a layer of tin onto the semiconductor substrate 101 through such commonly used methods as evaporation, electroplating, printing, solder transfer, ball placement, etc, to a thickness of, for example, about 100 μm. Once a layer of tin has been formed on the semiconductor substrate 101, a reflow may be performed in order to shape the material into the desired bump shapes.

Once the contact bumps 105 have been formed on the semiconductor substrate 101, the semiconductor substrate 101 may be attached to the substrate 103 by, for example, a flip-chip process. In this process the semiconductor substrate 101 is "flipped" such that the contact bumps 105 are facing the substrate 103. Once the contact bumps 105 are facing the substrate 103, the contact bumps 105 are aligned such that the contact bumps 105 will make physical and electrical contact with contact pads 109 on the substrate 103, thereby providing electrical connections between the substrate 103 and the semiconductor substrate 101. In an embodiment in which the contact bumps 105 are solder bumps, once electrical contact has been made, the contact bumps 105 may be reflowed in order to attach the semiconductor substrate 101 to the substrate 103.

Additionally, as one of ordinary skill in the art will immediately recognize, the flip-chip arrangement illustrated in FIGS. 1A and 1B and described above is not the only arrangement in which embodiments are applicable, and such an arrangement is not meant to be limiting to these embodiments. Other types of arrangements, such as through silicon vias (TSVs) or combinations of arrangements, such as TSVs and flip-chip arrangements, may alternatively be utilized. These arrangements and any other suitable types of arrangements, are fully intended to be included within the scope of the present embodiments.

Also shown in FIGS. 1A and 1B are cover marks 107 located on the substrate 103. The cover marks 107 may be used by an observer as an indication of how far the underfill material 201 (not shown in FIGS. 1A-1B but shown and described more fully below with respect to FIGS. 2A-2B) extends from underneath the semiconductor substrate 101. From the location of the cover marks 107, the placement of the underfill material 201 may be easily tracked such that additional unnecessary underfill material 201 is not needed to ensure an adequate encapsulation, thereby reducing any unnecessary covering of the underfill material 201.

The cover marks 107 may be located within or on the substrate 103 and adjacent to a region of attachment 115 (indicated by the dashed line) which will receive the semiconductor substrate 101. In an embodiment, when the semiconductor substrate 101 and substrate 103 are viewed from above after the semiconductor substrate 101 has been placed, the cover marks 107 extend away from the semiconductor substrate 101. Additionally, the cover marks 107 may include a straight piece 113 with hash marks 111 spaced along the straight piece 113 at regular lengths of a first distance $d_1$, such as between about 50 μm and about 500 μm, such as 100 μm. The hash marks 111 allow for a precise measurement of underfill material 201 once the underfill material 201 has been placed between the semiconductor substrate 101 and the substrate 103.

The cover marks 107 may be formed in the substrate 101 through, for example, the same photolithographic process used to form one of the layers of the substrate 101, such as the layer containing the contact pads 109. In an embodiment, the cover marks 107 may be formed of a conductor, such as aluminum, at the same time that contact pads 109 of the substrate 101 are formed. In this embodiment, the cover marks 107 may be formed using a deposition process, such as sputtering, CVD, electroplating, stencil printing, or jetting printing, to form a layer of material (not shown) and portions of the layer of material are then removed through a suitable process (such as photolithographic masking and etching) to form the cover marks 107 at the same time as the contact pads 109. By using such a process, the cover marks 107 may be formed without the need for separate processing steps.

However, as one of ordinary skill in the art will recognize, the structures and processes described are not the only structures and processes that may be suitable, and are not intended to limit the embodiments presented. Any suitable structure and process which provides for the formation of cover marks 107 which may be detected separately from the surrounding material may alternatively be utilized. For example, the cover marks 107 may alternatively be formed from dummy bumps, redistribution lines, redistribution vias, contact pads, dummy through silicon vias, open trenches/holes/patterns, combinations of these, or the like. All of these structures and their processes, and any other suitable structures and processes, may alternatively be utilized as cover marks 107.

Additionally, while the cover marks 107 are described as being formed as being exposed on the outermost layer of the substrate 103, the embodiments are not intended to be so limited. The cover marks 107 may be formed and located on any layer of the substrate 101 as long as the cover marks 107 are visible through any intervening layers. For example, the cover marks 107 may be formed on an underlying layer beneath the outermost layer of the substrate 101, and then covered by a transparent passivation layer (not shown). Such a procedure allows for the protection of the cover marks 107 while also retaining their ability to indicate the width of the underfill.

Figure 2A:
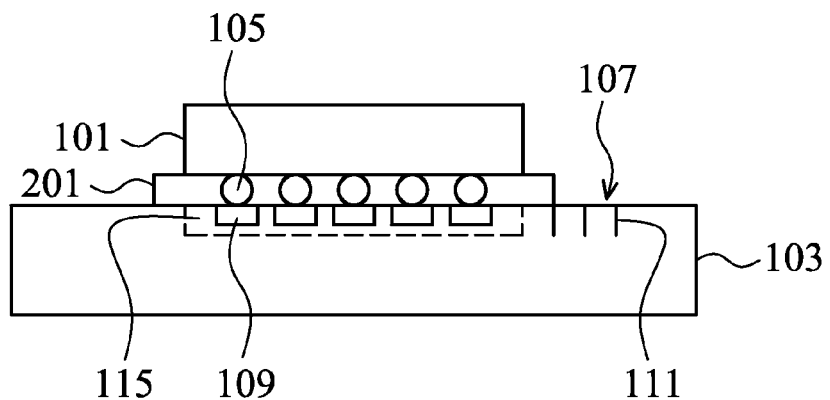
FIGS. 2A-2B illustrate a cross-sectional and plan view, respectively, of the semiconductor substrate and the substrate after an underfill material has been applied in accordance with an embodiment.
Figure 2B:
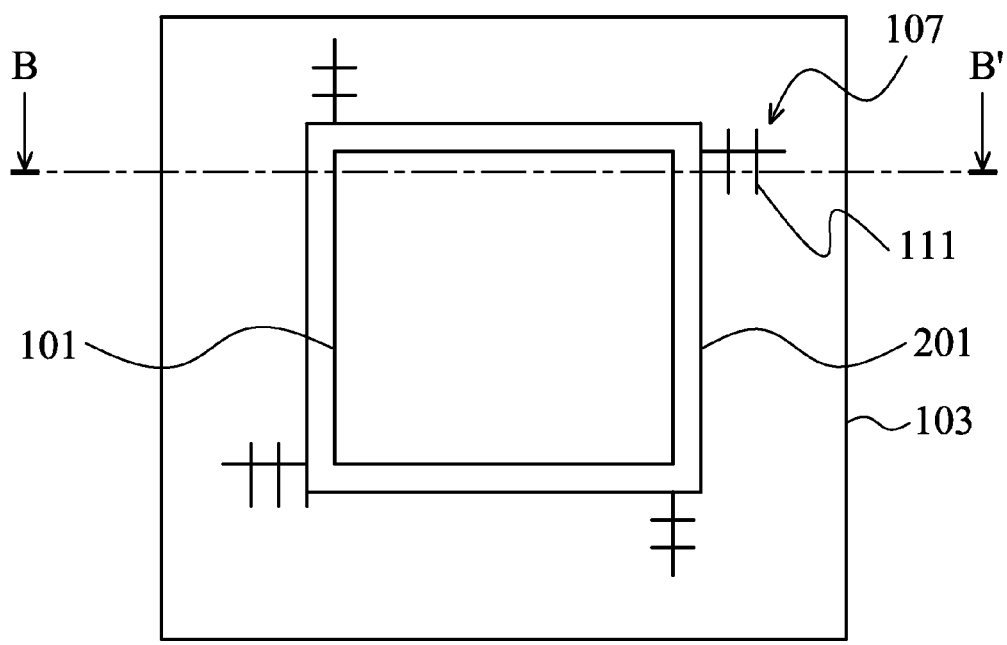

FIGS. 2A-2B illustrate a cross-sectional view and a plan view, respectively, of the semiconductor substrate 101 and the substrate 103 after an underfill material 201 has been applied, with FIG. 2A providing a cross-sectional view of FIG. 2B along line B-B'. The underfill material 201 may be injected or otherwise formed in the space between the semiconductor substrate 101 and the substrate 103. The underfill material 201 may, for example, comprise a liquid epoxy that is dispensed between the semiconductor substrate 101 and the substrate 103, and then cured to harden. This underfill material 201 may be used to prevent cracks from being formed in the contact bumps 205, wherein cracks are typically caused by thermal stresses.

Alternatively, the underfill material 201 may be either a deformable gel or silicon rubber formed between the semiconductor substrate 101 and the substrate 103 in order to help prevent cracks from occurring within the contact bumps 205. This gel or silicon rubber may be formed by injecting or otherwise placing the gel or rubber between the semiconductor substrate 101 and the substrate 103. The deformable gel or silicon rubber can provide greater stress relief during subsequent processing.

During or after the dispensing of the underfill material 201, the placement of the underfill material 201 may be checked by referencing the cover marks 107. Specifically, by viewing or otherwise determining how much of the cover marks 107 are covered or hidden from view by the underfill material 201, the amount and placement of the underfill material 201 may be determined. The checking may be performed using, for example, an optical microscope, although any suitable method of determining how much of the cover marks 107 are covered may alternatively be utilized.

To aid in this determination, and as illustrated in FIGS. 1A-2B, the cover marks 107 may comprise the hash marks 111 that extend outwards from the cover marks 107 (as discussed above with respect to FIGS. 1A-1B). When the spacing of the hash marks 111 is known, such as the first distance $d_1$ discussed above, the hash marks 111 allow for an easy determination of the extent of the underfill material 201 from a simple visual inspection of how many hash marks 111 are covered. In the embodiment illustrated in FIGS. 2A-2B, the underfill material 201 has laterally extended away from the semiconductor substrate 101 over the substrate 103 a distance of the first hash mark 111.

Figure 3A:
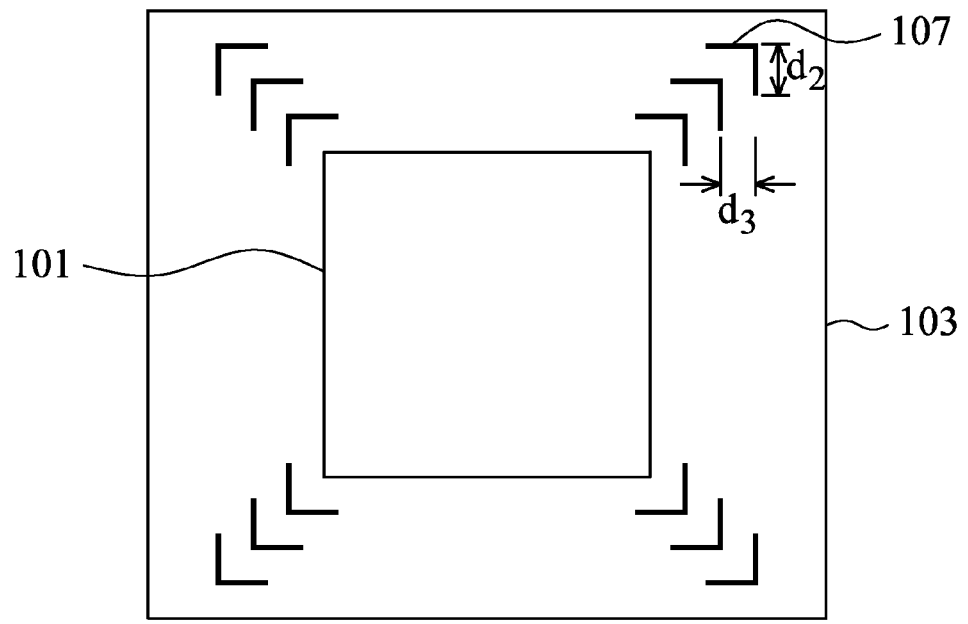
FIGS. 3A-3J illustrate various forms and shapes which may be used as cover marks in accordance with an embodiment.
Figure 3B:
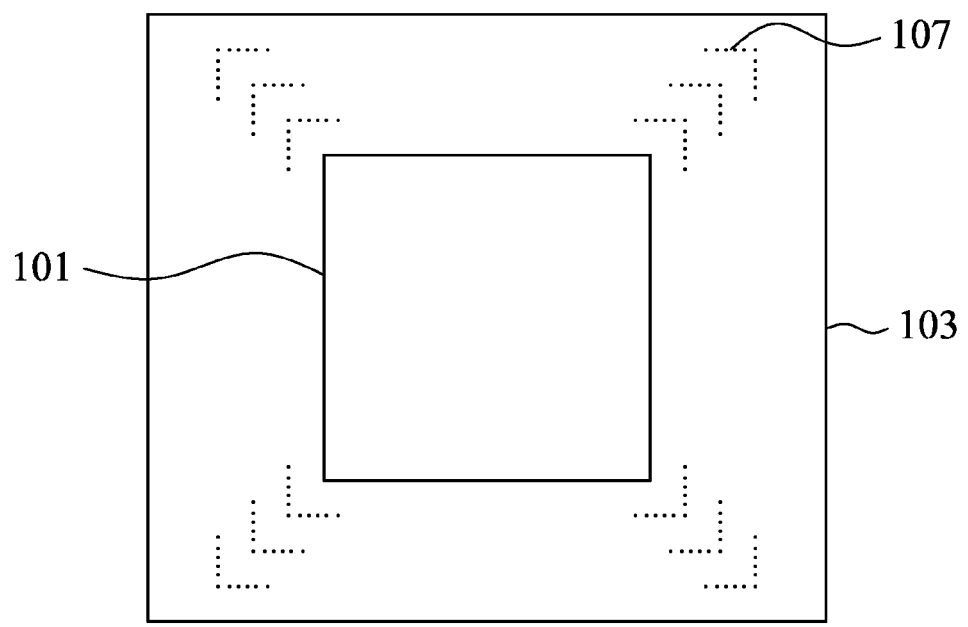

FIGS. 3A-3J illustrate various other forms and shapes which may be used as the cover marks 107. For example, FIGS. 3A-3B illustrate cover marks 107 in an "L" shape extending outwardly from the corners of the semiconductor substrate 101 (when viewed from above). FIG. 3A illustrates an embodiment in which the cover marks 107 are continuous lines, while FIG. 3B illustrates a similar embodiment in which the cover marks 107 are discontinuous lines. In such an embodiment, the cover marks 107 may have lengths of a second distance $d_2$ of between about 50 μm and about 500 μm, such as about 100 μm, and may be spaced apart from each other a third distance $d_3$ of between about 50 μm and about 500 μm, such as about 100 μm.

Figure 3C:
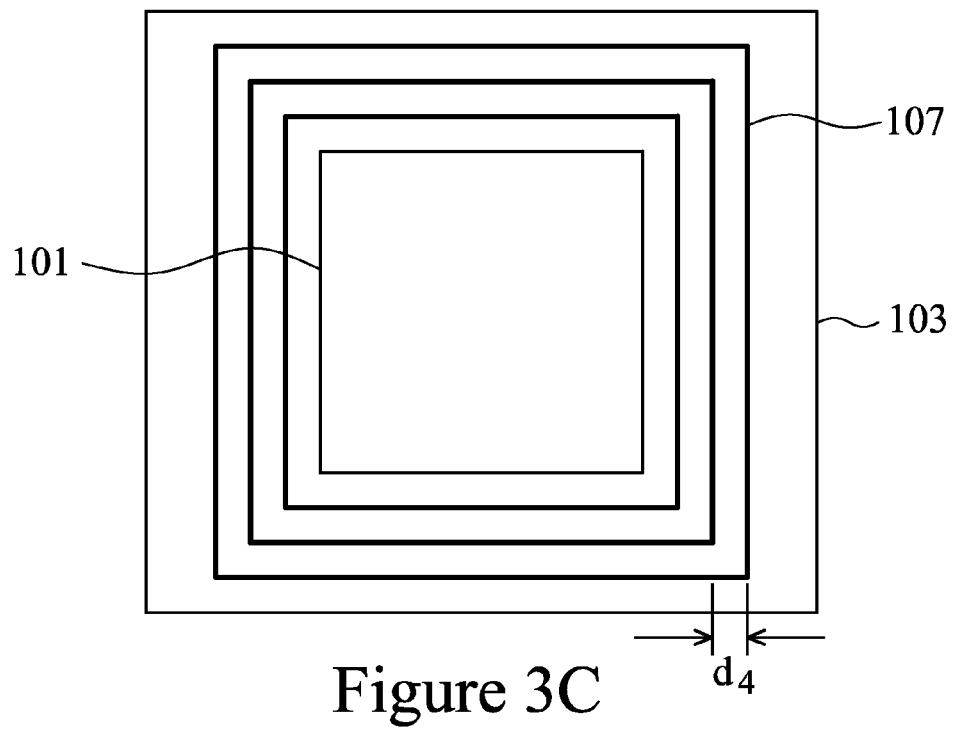
Figure 3D:
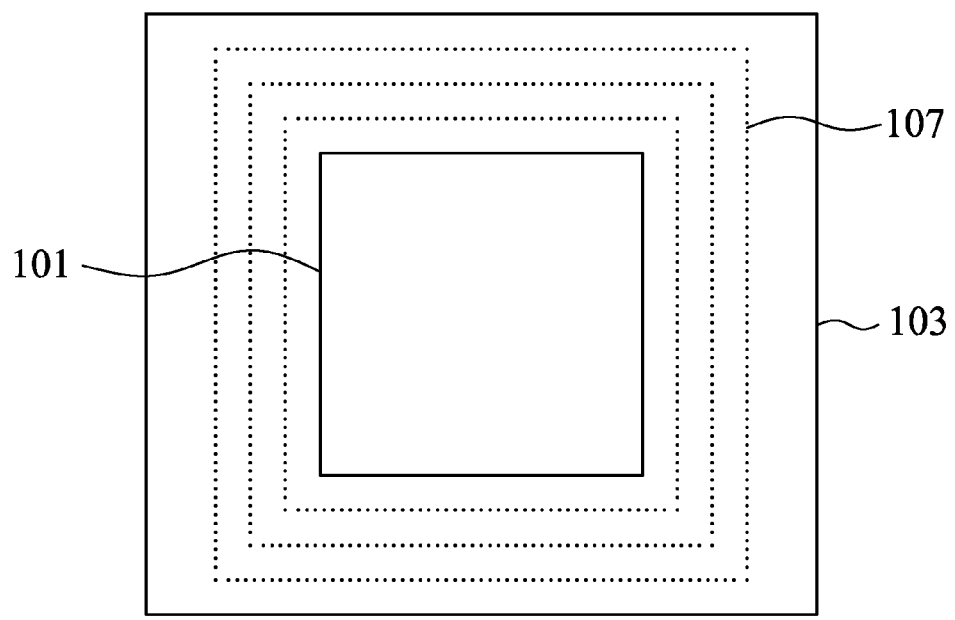

FIGS. 3C-3D illustrate cover marks 107 formed in the shape of concentric squares radiating outwardly from the semiconductor substrate 101 (when viewed from above). FIG. 3C illustrates an embodiment in which the cover marks 107 are continuous lines, while FIG. 3D illustrates a similar embodiment in which the cover marks 107 are discontinuous lines. In such an embodiment, the cover marks may be spaced apart from each other a fourth distance $d_4$ of between about 50 μm and about 500 μm, such as about 100 μm, although the cover marks 107 may be spaced greater or lesser than this amount. Additionally, the cover marks 107 may have different spacings between difference cover marks 107.

Figure 3E:
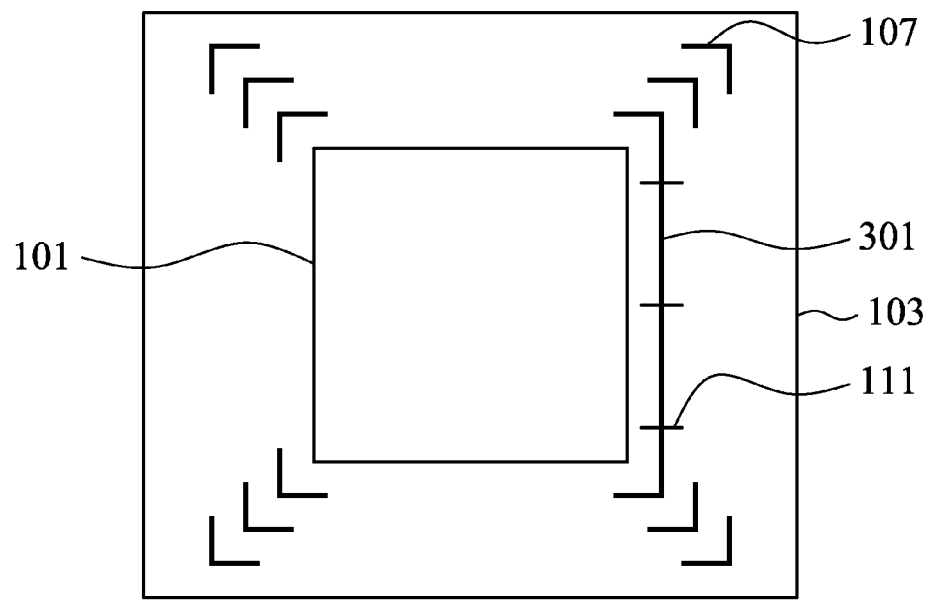
Figure 3F:
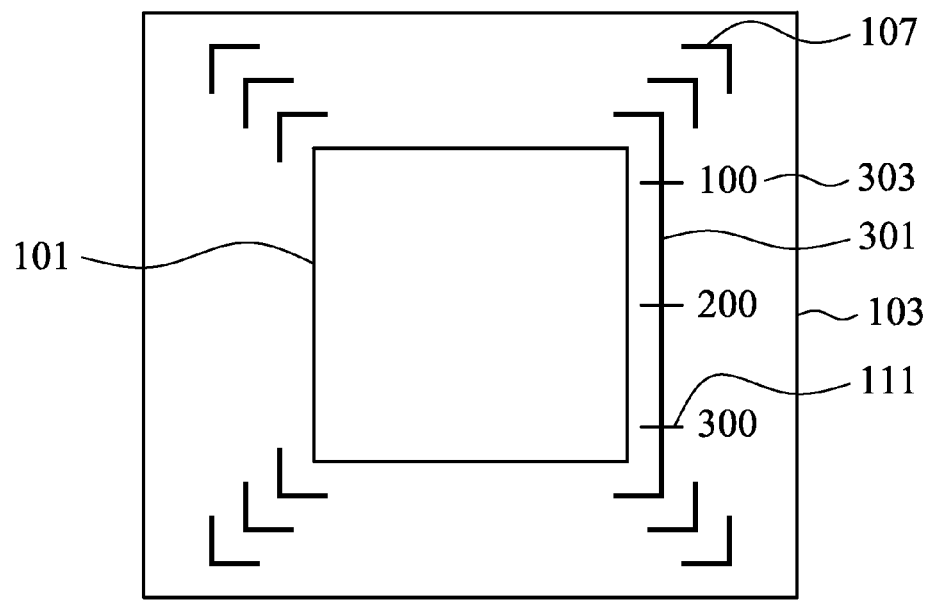

FIGS. 3E-3F illustrate an embodiment similar to the embodiment illustrated in FIG. 3A (with the cover marks 107 being an "L" shape and located at the corners of the semiconductor substrate 101), but additionally includes a scale 301. The scale 301 may be located on the substrate 103 along a side of the semiconductor substrate 101 (when viewed from above) and may be utilized to provide a reference to a viewer of the cover marks 107. In an embodiment, the scale 301 may extend from one cover mark 107, along a path parallel with the semiconductor substrate 101, and terminate at another cover mark 107 located along an opposite corner of the semiconductor substrate 101. Additionally, the scale 301 may additionally include hash marks 111 located at regular intervals (such as between every 50 μm and every 500 μm, such as about every 100 μm) in order to aid in the determination or estimation of distance.

FIG. 3F illustrates a cover mark 107 similar to the cover mark 107 described with respect to FIG. 3E, but with the addition of numbers 303. The numbers 303 may indicate either an index number or, as another alternative, may indicate the various distances along the scale 301. As an example only, in the embodiment illustrated in FIG. 3F, the first hash mark 111 along the cover mark 107 has the number 100, which indicates that the first hash mark 111 is located a distance of 100 μm an along the scale 301 from the corner of the cover mark 107. Additionally, as shown, each hash mark 111 is located a distance of 100 μm an from the previous hash mark 111, thereby providing an observer a reference scale 301 or key which allows the observer to better estimate the amount of underfill material 201 that has been placed between the semiconductor substrate 101 and the substrate 103.

Figure 3G:
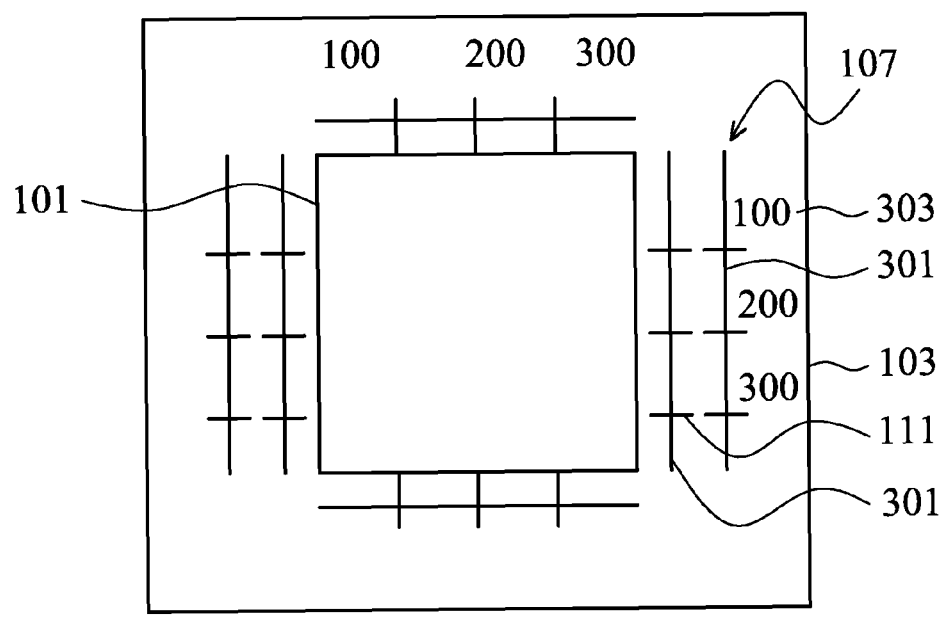

FIG. 3G illustrates another shape and form which may be used for the cover marks 107. In this embodiment, the cover marks 107 are in the form of a series of scales 301 (see FIGS. 3E-3F above) that are separated from each other as the series of scales 301 extend outward from the semiconductor substrate 101. Optionally, the scales 301 may or may not also include numbers 303 which indicate the distance each hash mark 111 of the scales 301 is located.

Figure 3H:
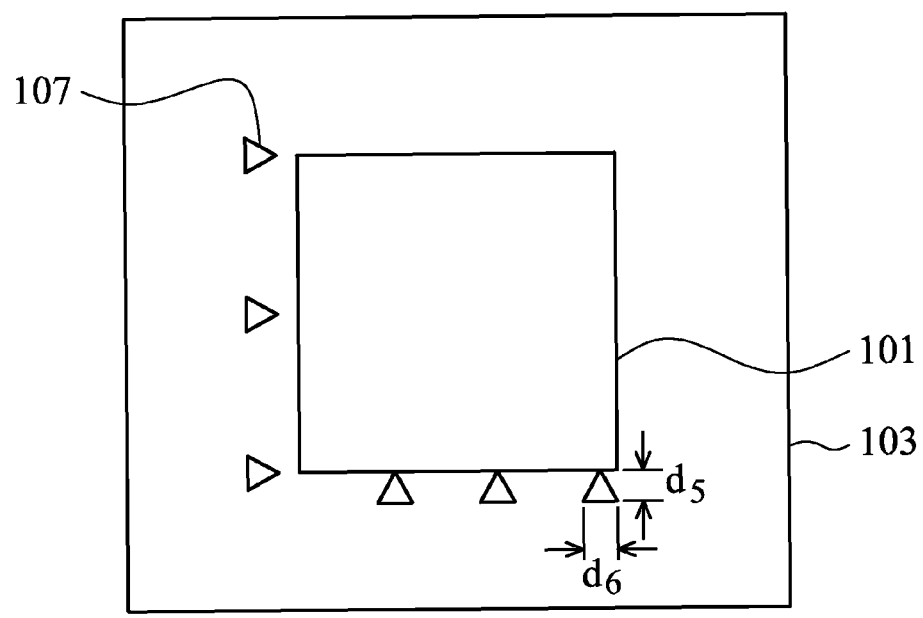

FIG. 3H illustrates cover marks 107 in the shape of triangles. For simplicity, the triangles may be formed along only two sides of the semiconductor substrate 101, although the triangles may be formed along any number of sides of the semiconductor substrate 101. The triangles may be formed to have a height that is a fifth distance $d_5$ of between about 50 μm an and about 500 μm, such as about 100 μm, and a width a sixth distance $d_6$ of between about 50 μm and about 500 μm, such as about 100 μm.

Figure 3I:
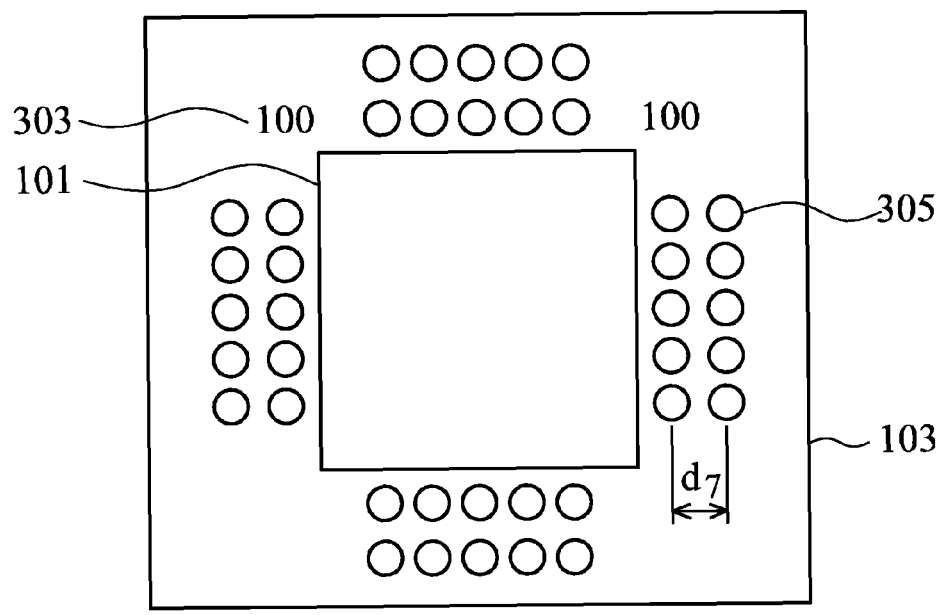

FIG. 3I illustrates an embodiment in which the cover marks 107 may be formed using dummy contact bumps 305. The dummy contact bumps 305 may be formed on the substrate 103 in a similar fashion as the contact bumps 105 described above with respect to FIG. 1A, except that the dummy contact bumps 305 are formed to be electrically inert, and as such, may or may not be connected to any of the contact pads 109. As illustrated, the dummy contact bumps 305 may be arranged in rows parallel to the sides of the semiconductor substrate 101 (when viewed from above), and the rows may be spaced apart from each other a seventh distance $d_7$ of between about 50 μm and about 500 μm, such as about 100 μm. Optionally, numbers 303 may also be formed in addition to the dummy contact bumps 305 in order to provide a reference for an observer.

Figure 3J:
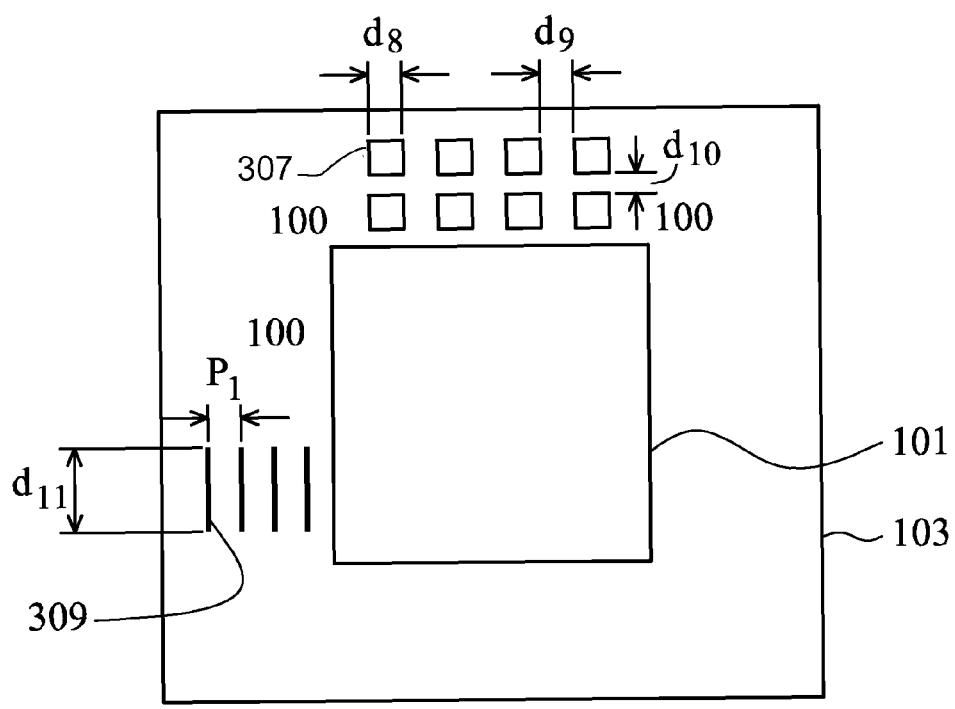

FIG. 3J illustrates an embodiment in which dummy pads 307 are utilized as the cover marks 107. The dummy pads 307 may be formed at the same time as the contact pads 109 described above with respect to FIG. 1A. However, because, the dummy pads 307 are dummies, the dummy pads 307 are not necessarily electrically connected to other devices (not shown) within the substrate 103. The dummy pads 307 may be formed to have a square dimension, with each side having an eight distance $d_8$ of between about 50 μm and about 500 μm, such as about 100 μm. Additionally, the dummy pads 307, while they may be arranged in any formation, are illustrated as being arranged in rows that are parallel to a side of the semiconductor substrate 101, wherein the individual dummy pads 307 are spaced apart from each other a ninth distance $d_9$ of between about 50 μm and about 500 μm, such as about 100

μm, and the rows are spaced apart from each other a tenth distance $d_{10}$ of between about 50 μm and about 500 μm, such as about 100 μm.

Additionally, FIG. 3J illustrates a second set of cover marks 107 that are in the form and shape of straight, continuous lines 309. The straight, continuous lines 309 may be arranged along a separate side of the semiconductor substrate 101 than the dummy pads 307, and may be formed to be parallel to the adjacent side of the semiconductor substrate 101 and have a length an eleventh distance $d_{11}$ of between about 50 μm and about 500 μm, such as about 100 μm a pitch $P_1$ of between about 50 μm and about 500 μm, such as about 100 μm. Optionally, numbers 303 may also be formed in order to provide a reference for an observer.

As one of ordinary skill in the art will recognize, the forms and shapes described above are merely exemplary structures and shapes which may be used as cover marks 107, and are not intended to limit the embodiments to just the structures and shapes described. Rather, any suitable structure or shape may alternatively be utilized as a cover mark 107, and all such forms and shapes are intended to be included within the scope of this disclosure. Additionally, combinations of different forms and shapes may also be utilized in order to best provide cover marks 107 that are easily readable and readily manufacturable.

Figure 4A:
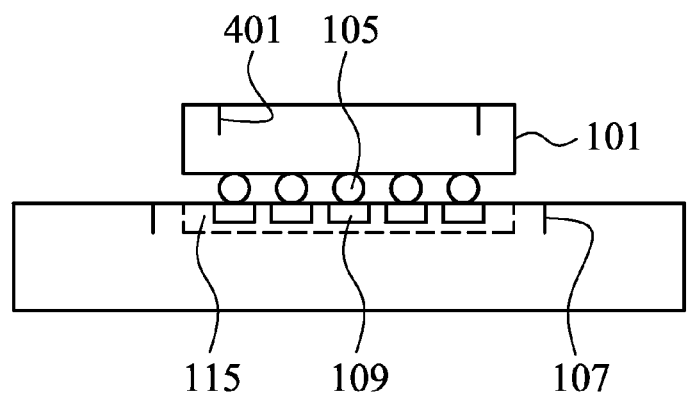
FIGS. 4A-4B illustrate a cross-sectional and plan view, respectively, of an embodiment in which cover marks are used as alignment marks in accordance with an embodiment.
Figure 4B:
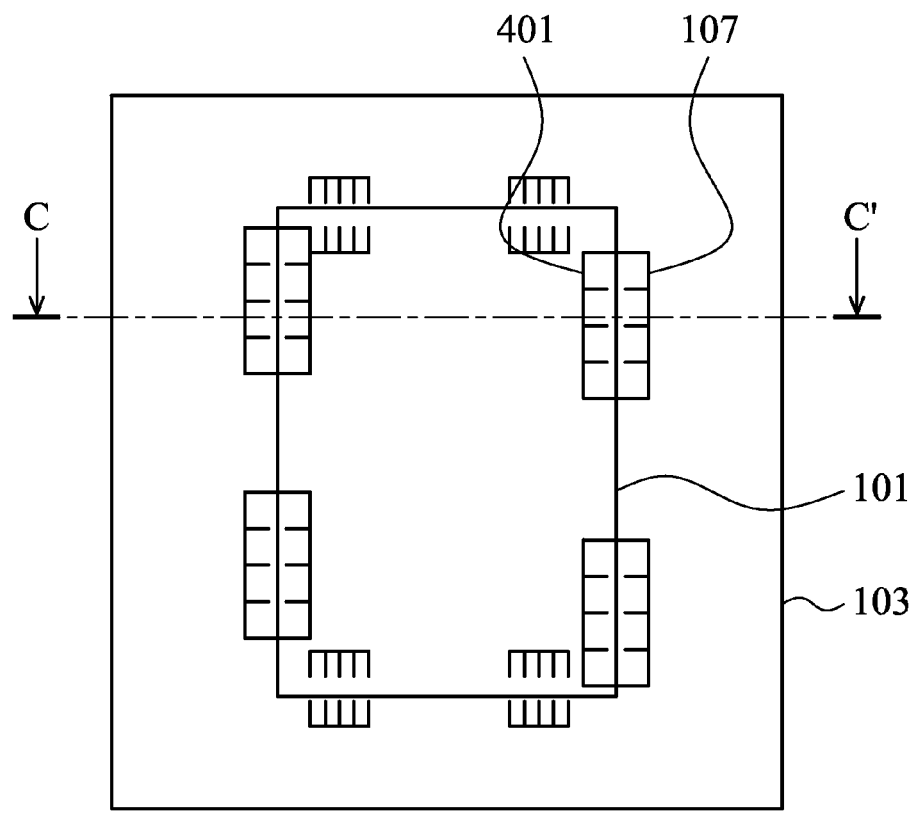

FIGS. 4A-4B illustrate a cross-sectional view and a plan view, respectively, of another embodiment, with FIG. 4A being a cross-sectional view of FIG. 4B along line C-C'. In this embodiment the cover marks 107 formed on the substrate 101 may be used in conjunction with semiconductor substrate cover marks 401 in order to assist in the alignment of the semiconductor substrate 101 with the substrate 103. The semiconductor substrate cover marks 401 may be formed on the semiconductor substrate 101 using processes similar to the processes described above with respect to the cover marks 107 in FIGS. 1A-1B. However, the semiconductor substrate cover marks 401 are formed such that, when the contact bumps 105 are in alignment with the contact pads 109, the semiconductor substrate cover marks 401 are also aligned with the cover marks 107 located on the substrate 103. Such an arrangement provides an observer the ability to see the appropriate alignment even though the contact bumps 105 and the contact pads 109 are hidden from view during the alignment process, thereby reducing any errors that may occur through misalignment of the semiconductor substrate 101 and the substrate 103.

Optionally, while an embodiment in which the semiconductor substrate cover marks 401 are located on an upper surface of the semiconductor substrate 101, additional processing may be performed to extend the semiconductor substrate cover marks 401 along one or more sides of the semiconductor substrate 101 (unseen in FIGS. 4A-4B). In an embodiment in which the semiconductor substrate 101 is a semiconductor die, the semiconductor die may be separated from a semiconductor wafer and additional processing, such as a suitable electrodeposition process, sputter, CVD, laser etching, etching stencil printing or jetting printing or etch, may be used to extend the semiconductor substrate cover marks 401 along the sides of the semiconductor substrate 101. By forming the semiconductor substrate cover marks 401 along the sides of the semiconductor substrate 101, the alignment process may be made easier as the alignment marks would be closer together when viewed at from any angle other than directly above.

By forming cover marks 107 on the substrate 103, an observer may better determine the precise placement of the underfill material 201, thereby leading to a more precisely placed underfill material 201. Such a precise placement would help to prevent the underfill material 201 from taking up more area on the substrate 101 than absolutely necessary, and also aid in the scaling down of semiconductor devices to smaller and smaller sizes. Additionally, by also using the cover marks 107 as alignment marks between the semiconductor substrate 101 and the substrate 103, alignment mismatches may be reduced as operators would have visual confirmations of alignment even though the contact bumps 105 and contact pads 109 are hidden from view during the actual alignment process.

Although the present embodiments and their advantages have been described in detail, it should be understood that various changes, substitutions and alterations can be made herein without departing from the spirit and scope of the embodiments as defined by the appended claims. For example, the cover marks may be formed in a variety of shapes, and different combinations of cover marks may be used to fit any particular situation.

Moreover, the scope of the present application is not intended to be limited to the particular embodiments of the process, machine, manufacture, composition of matter, means, methods and steps described in the specification. As one of ordinary skill in the art will readily appreciate from the disclosure of the present embodiments, processes, machines, manufacture, compositions of matter, means, methods, or steps, presently existing or later to be developed, that perform substantially the same function or achieve substantially the same result as the corresponding embodiments described herein may be utilized according to the present embodiments. Accordingly, the appended claims are intended to include within their scope such processes, machines, manufacture, compositions of matter, means, methods, or steps.

What is claimed is:

1. A semiconductor device comprising:
a substrate with a first surface, the substrate comprising a first cover mark located around a first region of the first surface; and
a semiconductor substrate attached to the first region, the semiconductor substrate having sidewalls aligned with edges of the first region, the semiconductor substrate comprising a second cover mark aligned with the first cover mark and located along a second surface facing away from the first surface.

2. The semiconductor device of claim 1, further comprising an underfill material located between the semiconductor substrate and the substrate, the underfill material extending away from the semiconductor substrate and covering at least a portion of the first cover mark.

3. The semiconductor device of claim 1, further comprising a third cover mark, a fourth cover mark, and a fifth cover mark located on the first surface of the substrate, the first cover mark, third cover mark, fourth cover mark, and fifth cover mark each being located adjacent to a separate side of the first surface.

4. The semiconductor device of claim 3, wherein each of the third cover mark, the fourth cover mark, and the fifth cover mark are aligned with respective ones of a plurality of cover marks located on the substrate.

5. The semiconductor device of claim 1, wherein the first cover mark comprises a straight line intersecting a series of hash marks.

6. A method of manufacturing a semiconductor device, the method comprising:
providing a substrate;
forming a first cover mark on a first surface of the substrate;

placing a semiconductor substrate over the first surface of the substrate;

placing an underfill material between the substrate and the semiconductor substrate, the underfill material extending towards the first cover mark from the region between the substrate and the semiconductor substrate; and determining a distance the underfill material extends from the semiconductor substrate using the first cover mark.

7. The method of claim 6, further comprising:

forming a second cover mark on a second surface of the semiconductor substrate; and aligning the semiconductor substrate such that the second surface faces away from the first surface and the second cover mark on the second surface is aligned with the first cover mark on the first surface.

8. The method of claim 6, wherein the forming the first cover mark further comprises forming a first contact pad on the first surface simultaneously as the forming the first cover mark.

9. The method of claim 6, wherein the forming a first cover mark further comprising forming a scale.

10. The method of claim 6, wherein the forming a first cover mark further comprises forming reference numbers on the first surface.

* * * * *